United States Patent [19]
George et al.

[11] 4,087,314
[45] May 2, 1978

[54] BONDING PEDESTALS FOR SEMICONDUCTOR DEVICES

[75] Inventors: William L. George, Scottsdale; Richard W. Wilson, Phoenix, both of Ariz.

[73] Assignee: Motorola, Inc., Schaumburg, Ill.

[21] Appl. No.: 723,006

[22] Filed: Sep. 13, 1976

[51] Int. Cl.² ............................................. C23F 1/02
[52] U.S. Cl. ..................................... 156/643; 29/591; 156/656; 204/192 EC; 357/68
[58] Field of Search ..................... 29/580, 589–591; 204/32 S, 33, 192; 427/88–92; 357/68, 69, 71; 156/643, 654–656, 659, 661

[56] References Cited

U.S. PATENT DOCUMENTS

| | | | |
|---|---|---|---|
| 3,653,999 | 4/1972 | Fuller | 204/192 C |
| 3,761,309 | 9/1973 | Schmitter et al. | 427/90 X |
| 3,833,842 | 9/1974 | Cunningham et al. | 29/590 X |
| 3,856,648 | 12/1974 | Fuller et al. | 204/192 EC |
| 3,900,944 | 8/1975 | Fuller et al. | 427/89 X |
| 3,983,023 | 9/1976 | Baker et al. | 204/192 E |

Primary Examiner—William A. Powell
Attorney, Agent, or Firm—Lowell E. Clark

[57] ABSTRACT

A metallization system and process for forming bonding pedestals suitable for subsequent gang-bonding of multi-leaded semiconductor devices. The metallurgical components are selected for corrosion resistance and permit the use of selective etchants for yield enhancement.

6 Claims, 1 Drawing Figure

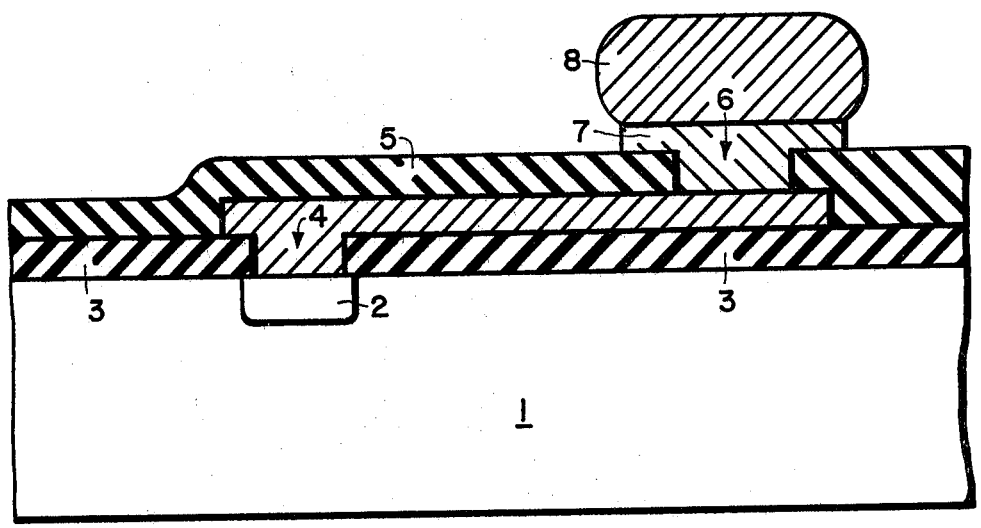

BONDING PEDESTALS FOR SEMICONDUCTOR DEVICES

SUMMARY

Multileaded semiconductor devices such as monolithic integrated circuits have traditionally been provided with external connections by wire bonding between the small bonding pads integral with the intra-device metallization and external metallic connectors which are mechanically supported by the package. To decrease costs and increase reliability, various methods for gang-bonding the device pads to the external metallic connections have been utilized or proposed. For example, flying leads have been provided by plating onto a semiconductor substrate containing multiple circuits, and then etching away the peripheral portion of the substrate around each circuit. Alternatively, solder pedestals have been provided over the bonding pad locations by evaporating solder through a mask; the individual circuits can then be soldered to an external metallization pattern such as a printed circuit. It is also known to selectively plate the bonding pads in order to provide pedestals suitable for gang-bonding of a metallic lead frame. In known sequences, however, the selective plating involves etching to delineate and/or remove the electrode for selective electroplating; this etching may attack the metallization pattern forming the intra device interconnects, leading to circuit failure due to open paths. Also, known metallization systems are subject to failure by corrosion or by undesirable intermetallic reactions.

The process disclosed here starts with selection of a silicon slice containing integrated circuits with conventional aluminum interconnect metallization and bonding pads about 0.1 mm on a side; just as used for conventional wire bonding. The whole slice with its aluminum metallization is then coated with a protective layer of glass. Vias are etched through this glass over the bonding pad locations. The aluminum in the vias is sputter etched or neutral ion cleaned in order to ensure good contact to a layer of titanium-tungsten which is sputtered over the wafer surface, typically followed by the sputter deposition of a thin layer of copper. A layer of photoresist is then applied, exposed and developed to open locations for pedestal formation opposite the vias. A thick layer of copper is then electrolytically plated using the titanium-tungsten-copper laminate as an electrode; this is followed by the plating of a thin layer of gold as a corrosion barrier. The resist is removed, the thin overall copper layer is etched, and the titanium-tungsten layer is removed by an etchant which does not attach aluminum, so that the aluminum interconnections are not destroyed if there are any defects in the overlying protective glass.

THE DRAWING

The FIGURE is a cross-section through a semiconductor device showing a pedestal illustrative of the present invention formed over one of the bonding pad locations.

DETAILED DESCRIPTION OF THE INVENTION

Structurally, the pedestals of the present invention comprise a thin layer of Ti—W and thick layer of a metal or metals which are readily plated. In FIG. 1, region 1 is a semiconductor substrate typically containing one or more regions of opposite conductivity type for forming active devices. Layer 3 is an insulator which passivates such devices and insulates metallic layer 4 from region 1. Glass layer 5 insulates conductor 4 and contains an opening or via 6 which exposes the bonding pad region of conductor 4. The bonding pedestal consists of a thin layer 7 of Ti—W and a thick layer or bump 8 of another metal or metals. Conductor 4 is typically aluminum or an aluminum alloy.

Good adhesion to the aluminum bonding pads is achieved by the Ti, and the W provides excellent corrosion resistance. While Al can be used for layer 7, its corrosion resistance is poor. The Ti—W layer 7 further provides a good barrier to prevent the diffusion of the metal 8 into the underlying aluminum. The method of forming the pedestals comprises sputter etching the aluminum bonding pads through the vias; sputtering the layer of Ti—W and a plating base metal, plating up the thick metal or metals through a photoresist mask, and etching the Ti—W in an etch that attacks aluminum very slowly. The structure and process are further illustrated by means of the two examples.

EXAMPLE I

The starting point for the process is a substrate wafer of conventional monolithic integrated circuits with aluminum interconnects overlain by a passivating glass and with aluminum bonding pads exposed by vias through the passivating glass. Aluminum alloys or other metals could be used, although aluminum has been found to be the most economical. The pedestal formation begins with vacuum processing to deposit the Ti—W and the plating base metal; details of such vacuum processing can be found for example in *Thin Film Microelectronics*, by L. Holland, John Wiley, 1966. The first step is to r.f. sputter or neutral ion mill the aluminum in the vias to remove any surface films, such as oxides, which may preclude good adhesion of the pedestal. Then approximately 2500Å of a film consisting of 10% Ti and 90% W is sputtered from a target of the same composition. This is followed by the sputter deposition of $\frac{1}{2}$ to 1 micron of Cu. At this point, the substrate wafer is removed from the vacuum and may be annealed at 400°–500° C in argon if needed to remove sputter-induced charge in the passivating oxides. The surface of the wafer is then coated with photoresist which is developed and exposed to provide openings at the desired sites for pedestal formation. The pedestals are formed by electroplating Cu through the holes in the photoresist using the sputtered Ti—W—Cu, which covers the whole surface of the substrate wafer, as an electrode. The metal is plated thick enough that the metallic members which are subsequently bonded to the pedestal will be sufficiently separated from the substrate to preclude shorts, but yet not so thick that adjacent pedestal plate together causing shorts. A thickness of about 25 microns has been found suitable although any thickness from 10–100 microns could be used. Following the copper plating, a thin layer (2000–5000Å) of a noble metal such as gold is plated to prevent corrosion of the copper so that bonding may be readily effected. After resist removal, the thin sputtered copper film is removed by an etch consisting of 5% nitric acid, 80% phosphoric acid, 5% acetic acid, and 10% H$_2$O (by volume, acids in the most concentrated commercially available form). This etch does not attach the Ti—W appreciably; the Ti—W is removed in an etch consisting of a 30% by volume mixture of H$_2$O$_2$ and water. This etch attacks aluminum extremely slowly so that the aluminum circuit metallization is not disturbed in case there are any pinhole defects in the overlying oxide passivation. The circuits can now be separated by conventional techniques and are then ready for lead attachment to the pedestal.

EXAMPLE II

The processing proceeds as in the previous Example except that ½ to 1 micron of Ni is sputtered over the Ti—W in place of the Cu to serve as plating base. After photoresist pattern formation, the thick pedestal plating is formed by plating about 10 microns of Ni followed by the plating of about 15 microns of Cu. The Ni has much lower thermal conductivity than the Cu, and serves to prevent thermal shock which may damage the pedestal during the subsequent bonding operation. After resist removal, the overall sputtered Ni film may be removed by etching in 35% solution of nitric acid and water. TiW removal is effected as in Example 1 by an etchant selected not to attack aluminum.

While the pedestal structure and concomitant fabrication sequence have been particularly illustrated by means of two examples, other metals, such as Ag or Au, may be used to form the thick plated portion of the pedestal, and likewise other etches are suitable for removing the plating base over the Ti—W, which may be from 1500 A to 5000 A thick.

What is claimed is:

1. A process for the formation of a bonding pedestal for a multileaded semiconductor device having aluminum or an aluminum alloy on-chip metallization covered with a passivating glass with vias exposing portions of said metallization therethrough, comprising:
   sputtering depositing a thin layer consisting of a mixture of Ti—W over the on-chip metallization;
   sputtering depositing a thin layer of a third metal suitable as a plating base over said Ti—W layer;
   selectively plating a thick layer of a metal selected from the group consisting of Ni, Cu, Ag, and Au over portions of said third metal over said vias but said thick layer not subtending all of said on-chip metallization;
   removing said third metal in areas where the thick layer was not plated; and
   etching said Ti—W layer in areas where the thick layer was not plated in an etchant which has an extremely slow attack rate of said on-chip metallization.

2. The process of claim 1 where said Ti—W is about 10% Ti and about 90% W by weight.

3. The process of claim 1 where said etchant consists of hydrogen peroxide and water.

4. The process of claim 1 further consisting of plating a thin layer of a noble metal over said thick layer.

5. The process of claim 1, further consisting of sputter etching or neutral ion milling said on-chip metallization through said vias prior to the sputter deposition of the Ti—W layer.

6. The process of claim 5, where said etchant consists of hydrogen peroxide and water.

* * * * *